(12) United States Patent
Solhusvik et al.

(10) Patent No.: US 9,231,011 B2
(45) Date of Patent: *Jan. 5, 2016

(54) STACKED-CHIP IMAGING SYSTEMS

(71) Applicant: SEMICONDUCTOR COMPONENTS INDUSTRIES, LLC, Phoenix, AZ (US)

(72) Inventors: Johannes Solhusvik, Haslum (NO); Tim Bales, Warfield (GB)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/543,582

(22) Filed: Nov. 17, 2014

(65) Prior Publication Data

US 2015/0115134 A1 Apr. 30, 2015

Related U.S. Application Data

(63) Continuation of application No. 13/401,764, filed on Feb. 21, 2012, now Pat. No. 8,890,047.

(60) Provisional application No. 61/537,508, filed on Sep. 21, 2011.

(51) Int. Cl.
*H01L 27/00* (2006.01)
*H01L 27/146* (2006.01)
*H04N 5/378* (2011.01)
(Continued)

(52) U.S. Cl.
CPC .......... *H01L 27/14636* (2013.01); *G06T 5/006* (2013.01); *H01L 27/14634* (2013.01); *H04N 5/345* (2013.01); *H04N 5/369* (2013.01); *H04N 5/378* (2013.01)

(58) Field of Classification Search
CPC .............. H01L 27/14603; H01L 27/14638

USPC ............ 250/208.1, 214.1; 257/432, 447, 448, 257/686, 774, 777, E27.13
See application file for complete search history.

(56) References Cited

U.S. PATENT DOCUMENTS

| | | | |
|---|---|---|---|
| 6,016,211 | A | 1/2000 | Szymanski et al. |
| 6,839,452 | B1 | 1/2005 | Yang et al. |

(Continued)

FOREIGN PATENT DOCUMENTS

| | | |
|---|---|---|
| EP | 2234387 | 9/2010 |
| JP | 11-150255 | 6/1999 |

(Continued)

OTHER PUBLICATIONS

Solhusvik et al., U.S. Appl. No. 13/401,601, filed Feb. 21, 2012.

*Primary Examiner* — Kevin Pyo
(74) *Attorney, Agent, or Firm* — Treyz Law Group; Michael H. Lyons

(57) ABSTRACT

Imaging systems may be provided with stacked-chip image sensors. A stacked-chip image sensor may include a vertical chip stack that includes an array of image pixels, analog control circuitry and storage and processing circuitry. The array of image pixels, the analog control circuitry, and the storage and processing circuitry may be formed on separate, stacked semiconductor substrates or may be formed in a vertical stack on a common semiconductor substrate. The image pixel array may be coupled to the control circuitry using vertical metal interconnects. The control circuitry may route pixel control signals and readout image data signals over the vertical metal interconnects. The control circuitry may provide digital image data to the storage and processing circuitry over additional vertical conductive interconnects coupled between the control circuitry and the storage and processing circuitry. The storage and processing circuitry may be configured to store and/or process the digital image data.

20 Claims, 7 Drawing Sheets

(51) Int. Cl.
*G06T 5/00* (2006.01)
*H04N 5/345* (2011.01)
*H04N 5/369* (2011.01)

(56) References Cited

U.S. PATENT DOCUMENTS

| | | | |
|---|---|---|---|
| 7,106,374 | B1 | 9/2006 | Bandera et al. |
| 7,200,293 | B2 | 4/2007 | Iwasaki |
| 7,394,148 | B2 | 7/2008 | Karnezos |
| 7,601,942 | B2 | 10/2009 | Underwood et al. |
| 7,906,363 | B2 | 3/2011 | Koyanagi |
| 8,890,047 | B2 * | 11/2014 | Solhusvik et al. ......... 250/208.1 |
| 2002/0149693 | A1 | 10/2002 | Tantalo et al. |
| 2007/0152345 | A1 | 7/2007 | Wu et al. |
| 2008/0083939 | A1 | 4/2008 | Guidash |
| 2010/0019130 | A1 | 1/2010 | Lee |
| 2010/0157072 | A1 | 6/2010 | Luo et al. |
| 2010/0213560 | A1 | 8/2010 | Wang et al. |
| 2010/0276572 | A1 | 11/2010 | Iwabuchi et al. |
| 2012/0273908 | A1 | 11/2012 | Kinsman et al. |

FOREIGN PATENT DOCUMENTS

| | | |
|---|---|---|
| JP | 2000032344 | 1/2000 |
| JP | 2001189891 | 7/2001 |
| JP | 2002044527 | 2/2002 |
| JP | 2002301057 | 10/2002 |
| JP | 2006-049361 | 2/2006 |
| JP | 2010-506404 | 4/2008 |
| JP | 2008118434 | 5/2008 |
| JP | 2008-235768 | 10/2008 |
| JP | 2009-170448 | 7/2009 |
| JP | 2010-199589 | 9/2010 |
| JP | 2010530633 | 9/2010 |
| JP | 2010-225927 | 10/2010 |
| JP | 2011023917 | 2/2011 |
| JP | 2011078049 | 4/2011 |
| KR | 10-2010-0106920 | 10/2010 |
| WO | 2006129762 | 7/2006 |
| WO | 2010073520 | 7/2010 |
| WO | 2011097687 | 8/2011 |

* cited by examiner

STACKED-CHIP IMAGING SYSTEMS

This application is a continuation of patent application Ser. No. 13/401,764, filed Feb. 21, 2012, which claims the benefit of provisional patent application No. 61/537,508, filed, Sep. 21, 2011, which are hereby incorporated by reference herein in their entireties. This application claims the benefit of and claims priority to patent application Ser. No. 13/401,764, filed Feb. 21, 2012, and provisional patent application No. 61/537,508, filed, Sep. 21, 2011.

BACKGROUND

This relates generally to imaging systems, and more particularly, to imaging systems with stacked-chip image sensors.

Image sensors are commonly used in imaging systems such as cellular telephones, cameras, and computers to capture images. In a typical arrangement, an image sensor is provided with an array of image sensor pixels and control circuitry for operating the image sensor pixels. In a conventional imaging system the control circuitry is laterally separated from the image sensor pixels on a silicon semiconductor substrate. Each row of image sensor pixels typically communicates with the control circuitry along a common metal line on the silicon semiconductor substrate. Similarly, each column of image sensor pixels communicates with the control circuitry along a common metal line.

In this type of system, the rate at which image pixel data can be read out from the image sensor pixels and the rate at which control signals can be supplied to the image sensor pixels can be limited by the use of the shared column and row lines. Additionally, this type of system requires space on the silicon semiconductor substrate to accommodate the control circuitry. This can increase the lateral footprint of the image sensor chip. An increased lateral footprint may be undesirable for compact imaging systems such as cellular telephones and cameras.

It would therefore be desirable to be able to provide improved imaging systems with enhanced pixel communication efficiency.

DETAILED DESCRIPTION

Digital camera modules are widely used in imaging systems such as digital cameras, computers, cellular telephones, or other electronic devices. These imaging systems may include image sensors that gather incoming light to capture an image. The image sensors may include arrays of image sensor pixels. The pixels in an image sensor may include photosensitive elements such as photodiodes that convert the incoming light into digital data. Image sensors may have any number of pixels (e.g., hundreds or thousands or more). A typical image sensor may, for example, have hundreds of thousands or millions of pixels (e.g., megapixels).

Each image sensor may be a stacked-chip image sensor having a vertical chip stack that includes an image pixel array, control circuitry, and digital processing circuitry. The analog control circuitry may be coupled to the image pixel circuitry using vertical conductive paths (sometimes called vertical metal interconnects or vertical conductive interconnects) such as through-silicon vias in a silicon semiconductor substrate. The storage and processing circuitry may be coupled to the analog control circuitry using vertical metal interconnects such as through-silicon vias in the silicon semiconductor substrate. Vertical metal interconnects may be formed at an edge of an image pixel array or throughout an image pixel array. Vertical metal interconnects may be configured to couple rows of image pixels, columns of image pixels, blocks of image pixels, other groups of image pixels, or individual image pixels to the analog control circuitry.

Figure 1:
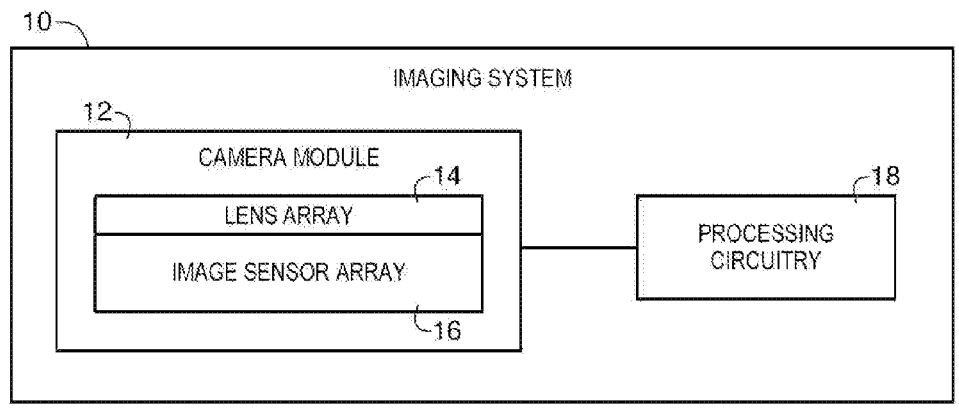
FIG. 1 is a diagram of an illustrative electronic device in accordance with an embodiment of the present invention.

FIG. 1 is a diagram of an illustrative imaging system that uses a stacked-chip image sensor to capture images. Imaging system 10 of FIG. 1 may be a portable imaging system such as a camera, a cellular telephone, a video camera, or other imaging device that captures digital image data. Camera module 12 may be used to convert incoming light into digital image data. Camera module 12 may include an array of lenses 14 and a corresponding array of stacked-chip image sensors 16. Lenses 14 and stacked-chip image sensors 16 may be mounted in a common package and may provide image data to processing circuitry 18.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Image sensor array 16 may contain an array of individual stacked-chip image sensors configured to receive light of a given color by providing each stacked-chip image sensor with a color filter. The color filters that are used for image sensor pixel arrays in the image sensors may, for example, be red filters, blue filters, and green filters. Each filter may form a color filter layer that covers the image sensor pixel array of a respective image sensor in the array. Other filters such as white color filters, dual-band IR cutoff filters (e.g., filters that allow visible light and a range of infrared light emitted by LED lights), etc. may also be used.

An array of stacked-chip image sensors may be formed on one or more semiconductor substrates. With one suitable arrangement, which is sometimes described herein as an example, each vertical layer of a stacked-chip image sensor array (e.g., the image pixel array layer, the control circuitry layer, or the processing circuitry layer) is formed on a common semiconductor substrate (e.g., a common silicon image sensor integrated circuit die). Each stacked-chip image sensor may be identical. For example, each stacked-chip image sensor may be a Video Graphics Array (VGA) sensor with a resolution of 480×640 sensor pixels (as an example). Other types of image sensor may also be used for the image sensors if desired. For example, images sensors with greater than VGA resolution or less than VGA resolution may be used, image sensor arrays in which the image sensors are not all identical may be used, etc. If desired, image sensor array 16 may include a single stacked-chip image sensor.

Figure 2:
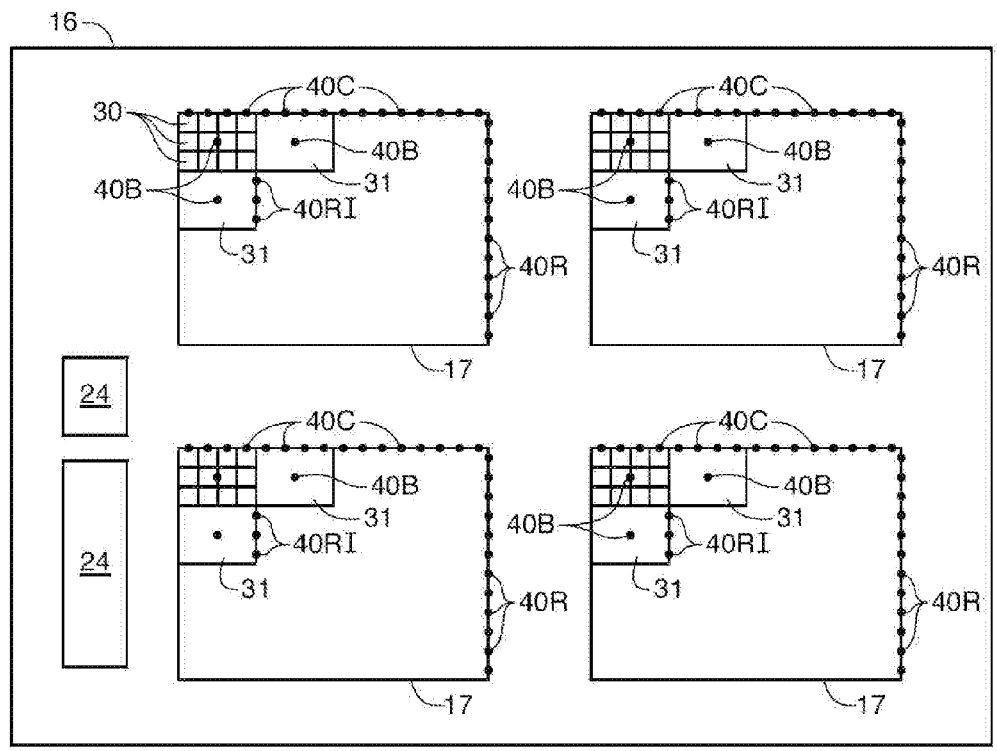
FIG. 2 is a top view of an illustrative image sensor array having a plurality of stacked-chip image sensors each having vertical conductive interconnects for coupling to control circuitry in accordance with an embodiment of the present invention.

As shown in FIG. 2, image sensor array 16 may include multiple image pixel arrays such as image pixel arrays 17 that are formed on a single integrated circuit die. In the example of FIG. 2, image sensor array 16 includes four stacked-chip image sensors. However, this is merely illustrative. If desired, image sensor array 16 may include a single stacked-chip image sensor, two stacked-chip image sensors, three stacked-chip image sensors, or more than four stacked-chip image sensors.

Each pixel array 17 may have image sensor pixels such as image pixels 30 that are arranged in rows and columns. Image sensor pixel arrays 17 may have any suitable resolution (e.g., 640×480, 4096×3072, etc.). Image sensor pixels 30 may be formed on a planar surface (e.g., parallel to the x-y plane of FIG. 2) of a semiconductor substrate such as a silicon die.

As shown in FIG. 2, each image pixel array 17 may be provided with a plurality of vertical conductive paths such as conductive interconnects 40 (e.g., metal lines, through-silicon vias, etc. that run perpendicular to the x-y plane of FIG. 2) such as row interconnects 40R, column interconnects 40C, pixel block interconnects 40B, and internal row interconnects 40RI. Row interconnects 40R, column interconnects 40C, pixel block interconnects 40B, and internal row interconnects 40RI may each be configured to couple one or more image pixels 30 to control circuitry (e.g., analog control circuitry) that is vertically stacked with the associated image pixel array (e.g., stacked in the z-direction of FIG. 2).

For example, a row interconnect 40R may couple an associated row of image sensor pixels 30 to control circuitry such as row driver circuitry that is vertically stacked with an image pixel array 17. Row interconnects 40R may be coupled to pixel rows along an edge of image pixel array 17. Each pixel row may be coupled to one of row interconnects 40R. A column interconnect 40C may couple an associated column of image sensor pixels 30 to control circuitry that is vertically stacked with an image pixel array 17. A block interconnect 40B may couple an associated block (e.g., blocks 31) of image sensor pixels 30 (e.g., a 4×4 pixel block, an 8×8 pixel block, a 16×16 pixel blocks, a 32×32 pixel block, etc.) to control circuitry such as analog-to-digital conversion circuitry that is vertically stacked with an image pixel array 17. An internal row interconnect 40RI may couple a portion of a row of image sensor pixels 30 to control circuitry that is vertically stacked with an image pixel array 17. Each pixel row in image pixel array 17 may be coupled to multiple internal row interconnects 40RI. Internal row interconnects 40RI may be coupled to image pixels 30 along an edge of one or more pixel blocks 31 and may couple the pixels 30 of that pixel block 31 to the control circuitry.

Row interconnects 40R, column interconnects 40C, pixel block interconnects 40B, and internal row interconnects 40RI may each be formed from, for example, through-silicon vias that pass from a first silicon semiconductor substrate (e.g., a substrate having an image pixel array) to a second silicon semiconductor substrate (e.g., a substrate having control and readout circuitry for the image pixel array).

Image sensor array 16 may, if desired, also include support circuitry 24 that is horizontally (laterally) separated from image pixel arrays 17 on the semiconductor substrate.

Figure 3:
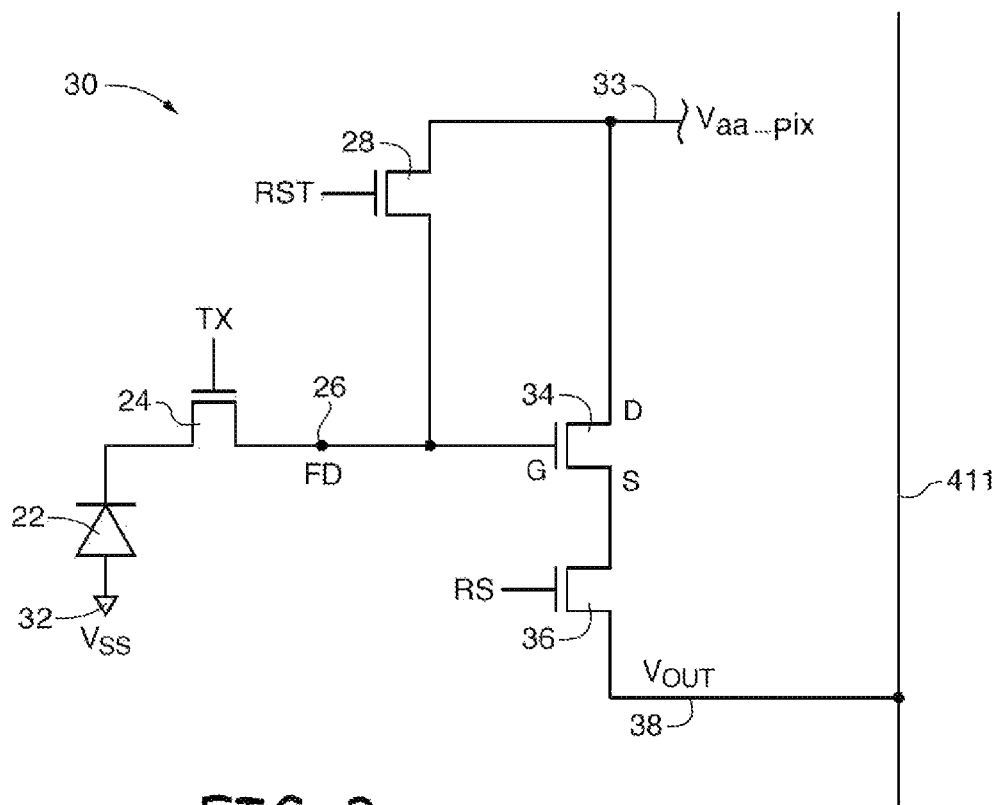
FIG. 3 is a diagram of an illustrative image sensor pixel in accordance with an embodiment of the present invention.

Circuitry in an illustrative pixel of one of the stacked-chip image pixel arrays in sensor array 16 is shown in FIG. 3. As shown in FIG. 3, pixel 30 may include a photosensitive element such as photodiode 22. A positive pixel power supply voltage (e.g., voltage Vaapix) may be supplied at positive power supply terminal 33. A ground power supply voltage (e.g., Vss) may be supplied at ground terminal 32. Incoming light is collected by photodiode 22 after passing through a color filter structure. Photodiode 22 converts the light to electrical charge.

Before an image is acquired, reset control signal RST may be asserted. This turns on reset transistor 28 and resets charge storage node 26 (also referred to as floating diffusion FD) to Vaa. The reset control signal RST may then be deasserted to turn off reset transistor 28. After the reset process is complete, transfer gate control signal TX may be asserted to turn on transfer transistor (transfer gate) 24. When transfer transistor 24 is turned on, the charge that has been generated by photodiode 22 in response to incoming light is transferred to charge storage node 26.

Charge storage node 26 may be implemented using a region of doped semiconductor (e.g., a doped silicon region formed in a silicon substrate by ion implantation, impurity diffusion, or other doping techniques). The doped semiconductor region (i.e., the floating diffusion FD) exhibits a capacitance that can be used to store the charge that has been transferred from photodiode 22. The signal associated with the stored charge on node 26 is conveyed to row select transistor 36 by source-follower transistor 34.

If desired, other types of image pixel circuitry may be used to implement the image pixels of sensors 16. For example, each image sensor pixel 30 (see, e.g., FIG. 1) may be a three-transistor pixel, a pin-photodiode pixel with four transistors, a global shutter pixel, etc. The circuitry of FIG. 3 is merely illustrative.

When it is desired to read out the value of the stored charge (i.e., the value of the stored charge that is represented by the signal at the source S of transistor 34), select control signal RS can be asserted. When signal RS is asserted, transistor 36 turns on and a corresponding signal Vout that is representative of the magnitude of the charge on charge storage node 26 is produced on output path 38. In a typical configuration, there are numerous rows and columns of pixels such as pixel 30 in the image sensor pixel array of a given image sensor. A conductive path such as path 41 can be associated with one or more pixels such as a column of pixels or a block of pixels.

When signal RS is asserted in a given row, a given block or a given portion of a row of pixels, path 41 can be used to route signal Vout from that row to readout circuitry. Path 41 may, for example, be coupled to one of column interconnects 40C. Image data such as charges collected by photosensor 22 may be passed along one of column interconnects 40C to associated control and readout circuitry that is vertically stacked with image pixel arrays 17.

Figure 4:
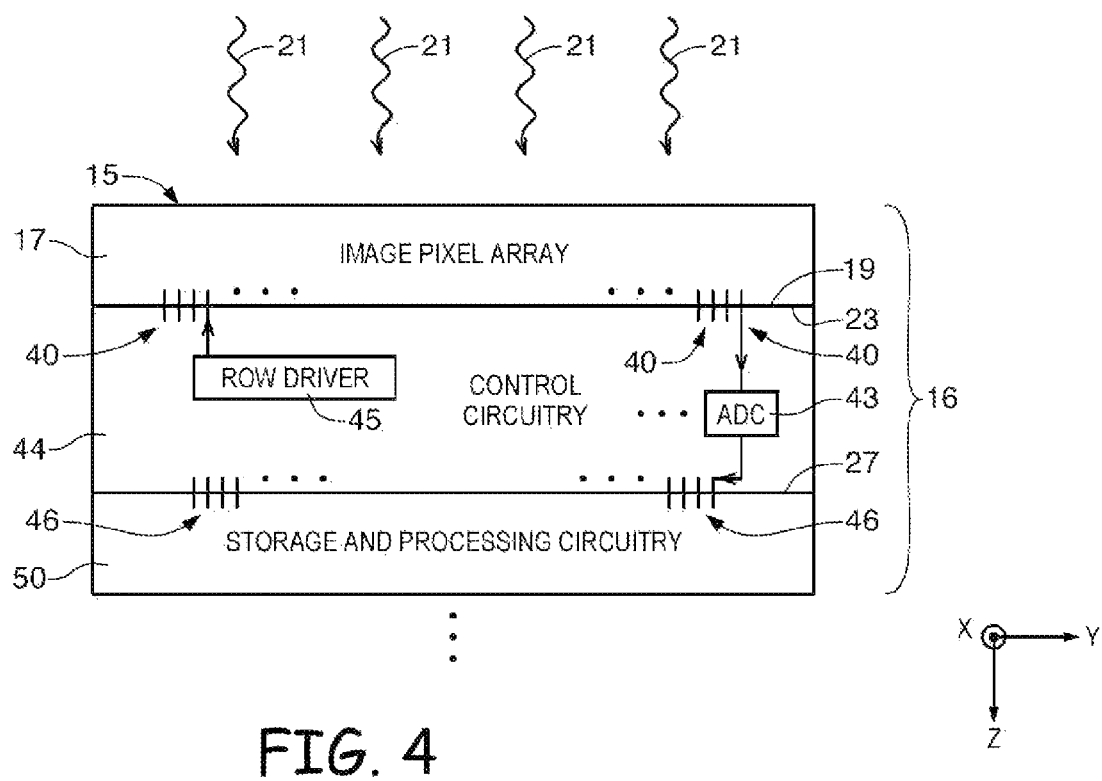
FIG. 4 is a diagram of an illustrative stacked-chip image sensor having an image pixel array in a vertical chip stack that includes analog control circuitry and storage and processing circuitry coupled by vertical metal interconnects in accordance with an embodiment of the present invention.

As shown in FIG. 4, an image pixel array such as image pixel array 17 may be formed in a vertical chip stack with analog control and readout circuitry such as control circuitry 44 and storage and processing circuitry such as storage and processing circuitry 50. Image pixel array 17 may be a frontside illuminated (FSI) image pixel array in which image light 21 is received by photosensitive elements through a layer of metal interconnects or may be a backside illuminated (BSI) image pixel array in which image light 21 is received by photosensitive elements formed on a side that is opposite to the side on which the layer of metal interconnects is formed.

Image pixel array 17 may be formed on a semiconductor substrate that is configured to receive image light 21 through a first surface (e.g., surface 15) of the semiconductor substrate. Control circuitry 44 may be formed on an opposing second surface (e.g., surface 19) of the semiconductor substrate. Control circuitry 44 may be formed on an additional semiconductor substrate (semiconductor integrated circuit die) having a surface such as surface 23 that is attached to surface 19 of image pixels array 17. Control circuitry 44 may be coupled to image pixels in image pixel array 17 using vertical conductive paths (vertical conductive interconnects) 40 (e.g., row interconnects 40R, column interconnects 40C, pixel block interconnects 40B, and/or internal row interconnects 40RI of FIG. 2). Vertical conductive interconnects 40 may be formed from metal conductive paths or other conductive contacts that extend through surface 19 and surface 23. As example, vertical conductive interconnects 40 may include through-silicon vias that extend through surface 19 and/or surface 23, may include microbumps that protrude from surface 19 into control circuitry substrate 44 through surface 23, may include microbumps that protrude from surface 23 into image pixel array substrate 17 through surface 23, or may include any other suitable conductive paths that vertically couple pixel circuitry in image pixel array 17 to control circuitry 44.

Image pixel array 17 may include one or more layers of dielectric material having metal traces for routing pixel control and readout signals to image pixels 30. Vertical conductive interconnects 40 (e.g., row interconnects 40R, column interconnects 40C, pixel block interconnects 40B, and/or internal row interconnects 40RI of FIG. 2) may be coupled to metal traces in image pixel array 17.

Image data such as signal Vout (FIG. 3) may be passed from pixel output paths 40 (FIG. 3) along interconnects 40 from image pixel array 17 to control circuitry 44. Control signals such as reset control signal RST, row/pixel select signal RS, transfer signal TX or other control signals for operating pixels 30 may be generated using control circuitry 44 and passed vertically to pixels 30 in image pixel array 17 along vertical interconnects 40.

Control circuitry 44 may be configured to operate pixels 30 of image pixel array 17. Control circuitry 44 may include row control circuitry (row driver circuitry) 45, bias circuitry (e.g., source follower load circuits), sample and hold circuitry, correlated double sampling (CDS) circuitry, amplifier circuitry, analog-to-digital (ADC) conversion circuitry 43, data output circuitry, memory (e.g., buffer circuitry), address circuitry, etc.

Control circuitry 44 may be configured to provide bias voltages, power supply voltages or other voltages to image pixel array 17. Control circuitry 44 may be formed as a stacked layer of image pixel array 17 that is coupled to pixel circuitry of pixel array 17 or may be formed on an additional semiconductor integrated circuit die that is coupled to image pixel array 17 using interconnects 40. Some interconnects 40 may be configured to route image signal data from image pixel array 17 to ADC converter 43. Digital image data from ADC converter 43 may then be provided to processing circuitry and storage 50. Storage and processing circuitry 50 may, for example, be an image coprocessor (ICOP) chip that is stacked with control circuitry 44.

Image data signals read out using control circuitry 44 from photosensitive elements on image pixel array 17 may be passed from control circuitry 44 to storage and processing circuitry 50 that is vertically stacked (e.g., in direction z) with image pixel array 17 and control circuitry 44 along vertical interconnects such as interconnects 46. Vertical interconnects 46 may include through-silicon vias, microbumps or other suitable interconnects that couple metal lines in control circuitry 44 to metal lines in processing circuitry and storage 50.

Circuitry 50 may be partially integrated into control circuitry 44 or may be implemented as a separated semiconductor integrated circuit that is attached to a surface such as surface 27 of control circuitry 44. Image sensor 16 may include additional vertical conductive interconnects 46 such as metal conductive paths or other conductive contacts that extend through surface 27. As examples, vertical conductive interconnects 46 may include through-silicon vias that extend through surface 27, may include microbumps that protrude from surface 27 into processing circuitry substrate 50, or may include any other suitable conductive paths that vertically couple control circuitry 44 to storage and processing circuitry 50.

Processing circuitry 50 may include one or more integrated circuits (e.g., image processing circuits, microprocessors, storage devices such as random-access memory and non-volatile memory, etc.) and may be implemented using components that are separate from control circuitry 44 and/or that form part of control circuitry 44.

Image data that has been captured by image pixel array 17 may be processed and stored using processing circuitry 50. For example, processing circuitry 50 may be configured to perform white balancing, color correction, high-dynamic-range image combination, motion detection, object distance detection, or other suitable image processing on image data that has been passed vertically from control circuitry 44 to processing circuitry 50. Processed image data may, if desired, be provided to external equipment (e.g., a computer, other device, or additional processing circuitry such as processing circuitry 18) using wired and/or wireless communications paths coupled to processing circuitry 50.

Processing circuitry 50 formed in a vertical stack with image pixels of a stacked-chip image sensor may, for example, select a subset of digital image data to use in constructing a final image and extracting image depth information for the user of system 10. For example, circuitry 50 may be used to blend image data from red, blue, and green sensors to produce full-color images, may be used to determine image parallax corrections, may be used to produce 3-dimensional (sometimes called stereo) images using data from two or more different sensors that have different vantage points when capturing a scene, may be used to produce increased depth-of-field images using data from two or more image sensors, may be used to adjust the content of an image frame based on the content of a previous image frame, or may be used to otherwise process image data. In some modes of operation, multiple stacked-chip image sensors on array 16 may be active (e.g., when determining 3-dimensional image depth information). In other modes of operation (e.g., color imaging), only a subset of the image sensors may be used. Other sensors may be inactivated to conserve power (e.g., their positive power supply voltage terminals may be taken to a ground voltage or other suitable power-down voltage and their control circuits may be inactivated or bypassed).

Figure 5:
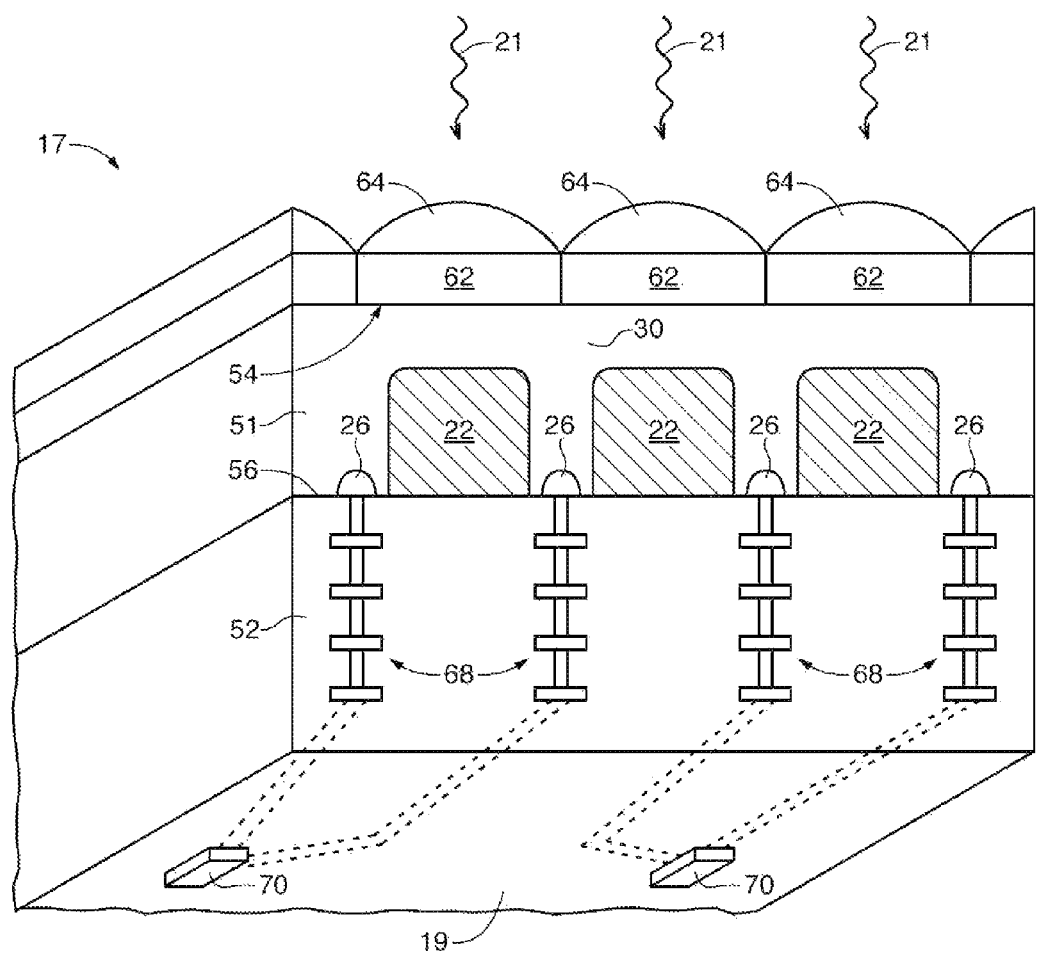
FIG. 5 is a perspective view of an illustrative image pixel array in accordance with an embodiment of the present invention.

FIG. 5 is a perspective view of illustrative circuitry that may be used in an image pixel array such as image pixel array 17. In the example of FIG. 5, image pixel array 17 is a backside illuminated (BSI) image pixel array. Image pixel array 17 may be formed from one or more silicon substrates such as substrate 51 and dielectric stack 52. Each pixel may include a photodiode 22 formed in a front side of silicon substrate 51. Each pixel may also include an associated floating diffusion region 26 formed in the front side of substrate 51.

A dielectric stack 52 may be formed on front side 56 of substrate 51. Dielectric stack 52 may include metal interconnect structures 68 formed in dielectric material (e.g., silicon, or silicon dioxide). Metal interconnect structures may include metal routing lines and metal vias in the interlevel dielectric (ILD) layers. Conductive bond pads 70 may, if desired, be formed surface 19 of image pixel array 17 and coupled to interconnect structures 68.

A color filter array 62 may be formed on backside 54 of substrate 51. A respective microlens 64 may cover each color filter pixel element 62. Light 21 can enter from the back side of the image pixels through microlenses 28. The incoming light may be absorbed by photodiodes 22. A BSI image sensor such as pixel array 17 may be stacked onto a second semiconductor substrate such as control circuitry substrate 44 (FIG. 4). Bond pads 70 may be coupled directly to associated bond pads on control circuitry 44, may be coupled directly to vertical interconnects 40 (FIG. 4), or metal interconnect structures 68 may form a portion of vertical interconnects 40 that couple pixel circuitry (e.g., transistors 34, transistors 36, etc.) to control circuitry 44.

The configuration of FIG. 5 is merely illustrative. If desired, image pixel array 17 may be a front-side illuminated image sensor that is vertically stacked onto control circuitry 44.

Figure 6:
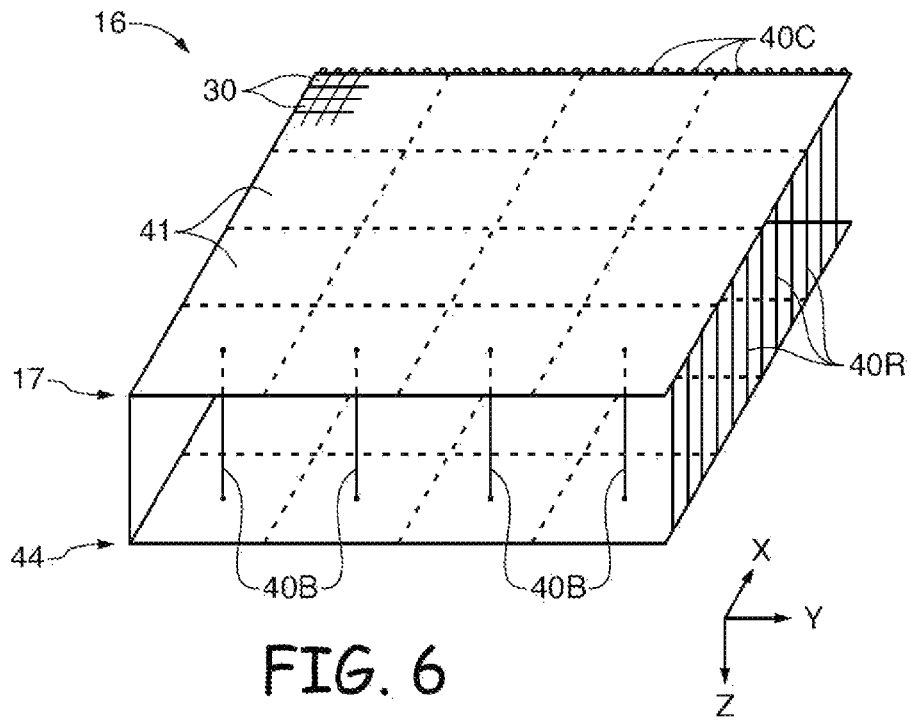
FIG. 6 is a diagram of a portion of an illustrative stacked-chip image sensor showing how vertical metal interconnects may couple blocks of image sensor pixels to control circuitry that is vertically stacked with the image pixel array in accordance with an embodiment of the present invention.

As shown in FIG. 6, image pixel array 17 may be coupled to control circuitry 44 using vertical row interconnects 40R, vertical column interconnects 40C, and vertical block interconnects 40B. Control circuitry 44 may, for example, be configured to generate and provide control signals (e.g., reset signals, transfer signals, row select signals, etc.) for a given row of pixels 30 along vertical row interconnects 40R. Control circuitry 44 may, for example, be configured to generate and provide control signals (e.g., bias voltages, power supply voltages, etc.) for a given column of pixels 30 along vertical column interconnects 40C. Control circuitry 44 may, for example, include analog-to-digital (ADC) conversion circuitry that receives image data from pixels 30 in a given block 41 of pixels 30 along vertical block interconnects 40B. Each pixel 30 in a block 41 may be coupled to the vertical block interconnect 40B that is associated with that block 41.

During operation of imaging system 10, control circuitry 44 may, at a common time, select multiple row of pixels 30 by asserting a row select signal RS along associated vertical row interconnects 40R. While the row select signal RS is being asserted along the associated vertical row interconnects 40R, control circuitry 44 may provide power to source follower transistors in multiple column of pixels 30 along associated vertical column interconnects 40C, thereby operating the source follower transistor of pixels in the selected columns and the selected rows so that image data from that pixel may be simultaneously read out along block interconnects 40B.

Each block 41 may include any number of pixels (e.g., a 16×16 block of pixels, a 32×32 block of pixels, etc.). In one suitable configuration which is sometimes discussed herein as an example, an image pixel array may be a 4096×3072 array of image pixels (e.g., spaced at a 1-2 micron pitch on a semiconductor substrate) and each block 41 may contain a sub-array of 32×32 pixels. In this example, control circuitry 44 may include an array of 128×96 ADC's (e.g., spaced at a 30-40 micron pitch on a second, stacked semiconductor substrate), and each ADC may be coupled to one of block interconnects 40B. In this way, the pixels of all blocks 41 may be read out in parallel thereby allowing image data to be captured and read out at a higher frame rate than is possible using conventional image sensors (e.g., hundreds of frames per second, thousands of frames per second or more) and/or allowing imaging system 10 to be operated at a slower clock speed than is possible using conventional image sensors, thereby reducing the power consumption of imaging system 10.

In configurations in which stacked-chip image sensor 16 captures hundreds or thousands of image frames per second, circuitry 46 may be configured to combine any number of frames to form a global shutter image, a high-dynamic-range image, an image having depth information, a motion-corrected image, or other output image formed from combined, processed image frames.

Figure 7:
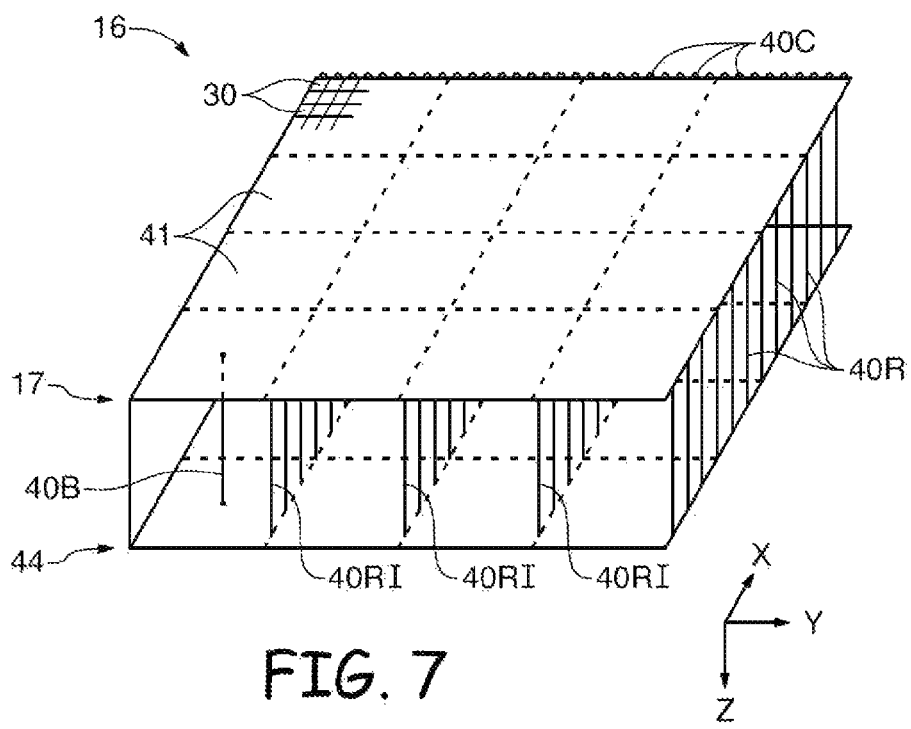
FIG. 7 is a diagram of a portion of an illustrative stacked-chip image sensor showing how vertical metal interconnects may couple portions of rows of image sensor pixels to control circuitry that is vertically stacked with the image pixel array in accordance with an embodiment of the present invention.

In some configurations, image pixel array 17 may include a large number of pixels (e.g., thousands of pixels or more) in each row. This can sometimes cause difficulties in providing consistent control signals (e.g., RST, RS, etc.) to all pixels in a row. As shown in FIG. 7, stacked-chip image sensor 16 may be provided with vertical internal row interconnects 40RI associated with each image pixel block 41 within image pixel array 17. Each internal row interconnect 40RI may be configured to provide control signals (e.g., transfer control signal TX, row select signal RS, or reset signal RST) from control signal 34 to pixels 30 in the associated row of the associated pixel block.

If desired, some of vertical internal row interconnects 40RI may be configured to carry image data signals from pixels 30 of the associated pixel block 41 to control circuitry 44. However, this is merely illustrative. If desired, image data may be read out from pixels 30 of a given pixel block 41 over a vertical block interconnect 40B while (for example) a row select signal RS is provided to the given pixel block over one of vertical internal row interconnects 40RI.

Figure 8:
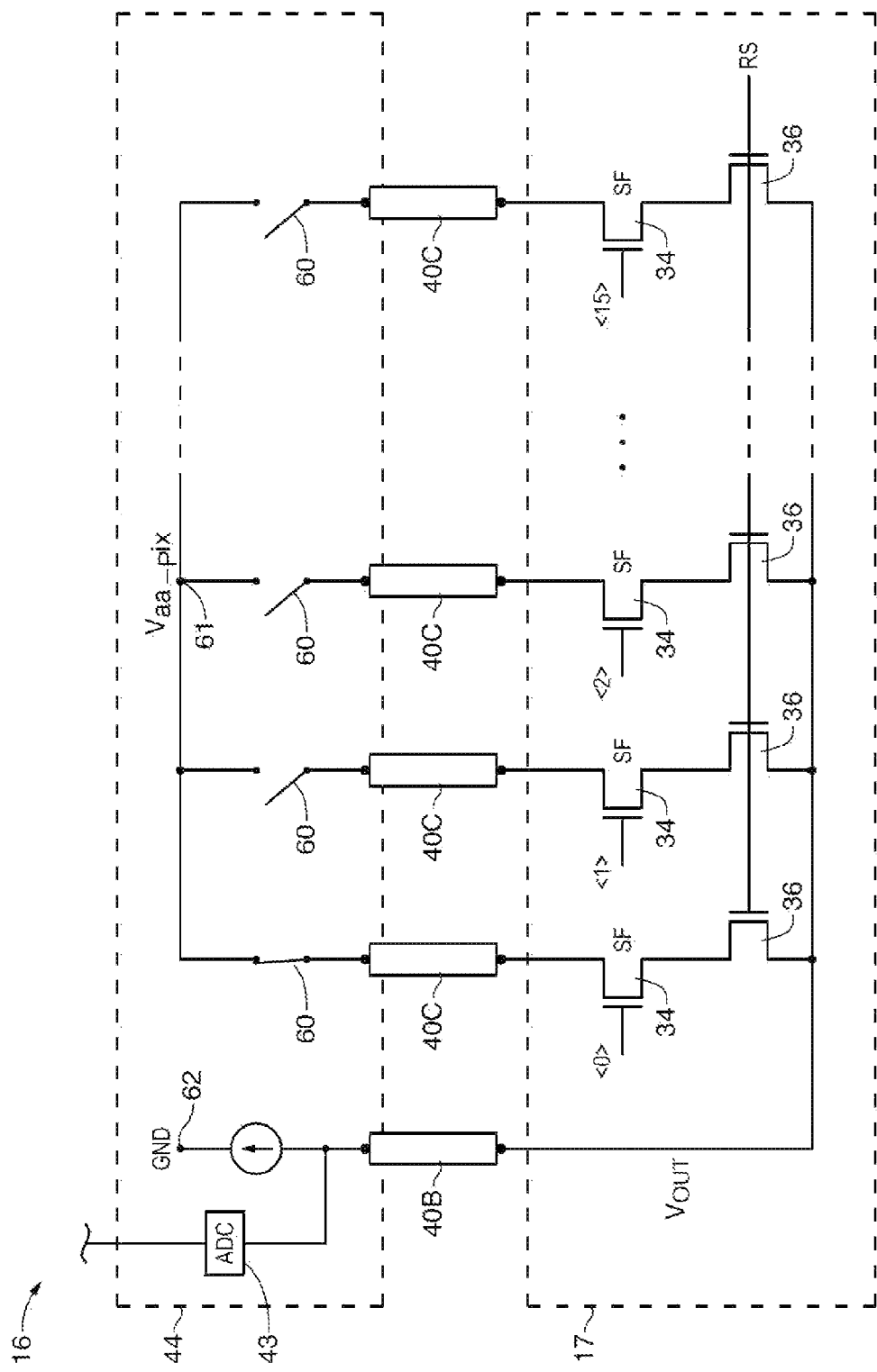
FIG. 8 is a diagram of illustrative circuitry in a stacked-chip image sensor showing how image sensor pixel circuitry in the image pixel array may be coupled to components of the analog control circuitry in accordance with an embodiment of the present invention.

As shown in FIG. 8, vertical column interconnects 40C may be coupled between the source follower transistors 34 of each column of pixels and a common voltage supply terminal such as terminal 61 that provides a pixel power supply voltage Vaa_pix. Control circuitry 44 may include a switch 60 coupled between each vertical column interconnect 40C and the source follower transistors 34 of that column.

During readout operations of imaging system 10, a row select signal RS may be provided to a row of pixels (e.g., over a vertical row interconnect). While the row select signal RS is provided to that row of pixels, one of switches 60 may be closed in order to provide power supply voltage Vaa_pix to the source follower transistors 34 of that column of pixels. Image data charges stored on a pixel storage region that is coupled to the gate of the powered source follower transistor 34 may be converted into an image data signal (e.g., Vout) and provided to a vertical readout interconnect such as block interconnect 40B. Image data signal Vout may be provided to an ADC conversion circuit such as ADC circuit 43. If desired, both control circuitry 44 and image pixel array 17 may be coupled to a common ground plane 62 that is coupled to block interconnects such as block interconnect 40B and is configured to supply a ground supply voltage GND. However, the configuration of FIG. 8 is merely illustrative.

Figure 9:
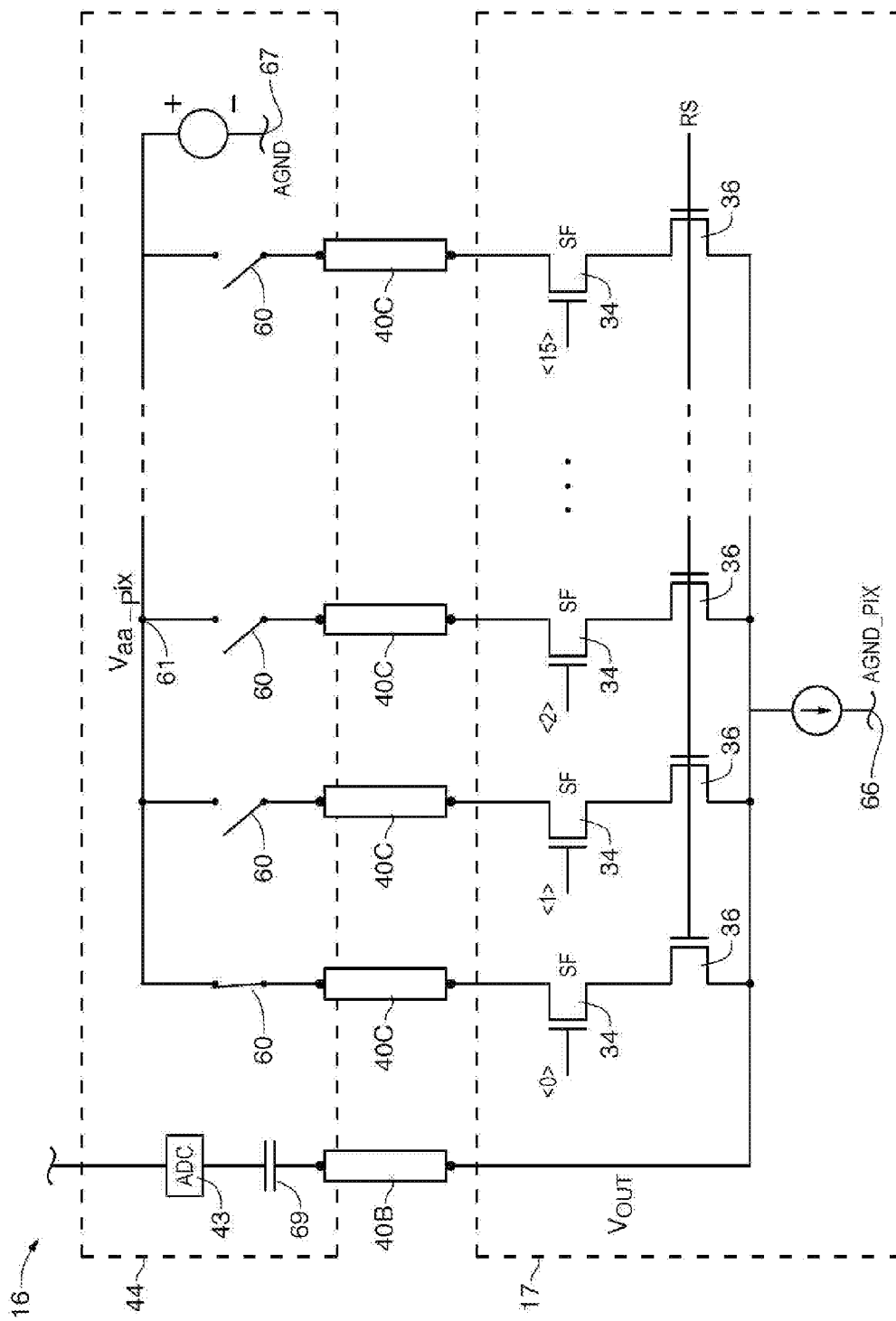
FIG. 9 is a diagram of illustrative circuitry in a stacked-chip image sensor showing how the ground plane of the analog control circuitry may be separate from the ground plane of the image pixel array in accordance with an embodiment of the present invention.

If desired, image pixel array 17 and control circuitry 44 may each include a ground supply voltage terminal (e.g., semiconductor integrated circuit dies having image pixel array 17 and control circuitry 44 may each include a ground plane) as shown in FIG. 9. Ground supply 67 may be configured to supply a ground supply voltage 67 to control circuitry 44. Ground supply 66 may be configured to supply a pixel ground supply voltage AGND_PIX to pixels 30 of image pixel array 30. Ground supply terminals (e.g., ground planes) 66 and 67 may be mutually decoupled so that, for example, electrostatic discharges in one of image pixel array 17 and control circuitry 44 are decoupled from the other of image pixel array 17 and control circuitry 44. Providing image sensor 16 with separate ground planes as shown in FIG. 9 may also reduce electronic noise that is transferred from control circuitry 44 into image data from image pixel array 17.

As shown in FIG. 9, in configurations in which image pixel array 17 includes a separate ground supply 66, ADC circuit 43 may include an alternating-current (AC) connection (e.g., using a capacitor such as capacitor 69 coupled between the ADC circuit and the pixel circuitry) to signal readout interconnects such as vertical block interconnects 40B.

Figure 10:
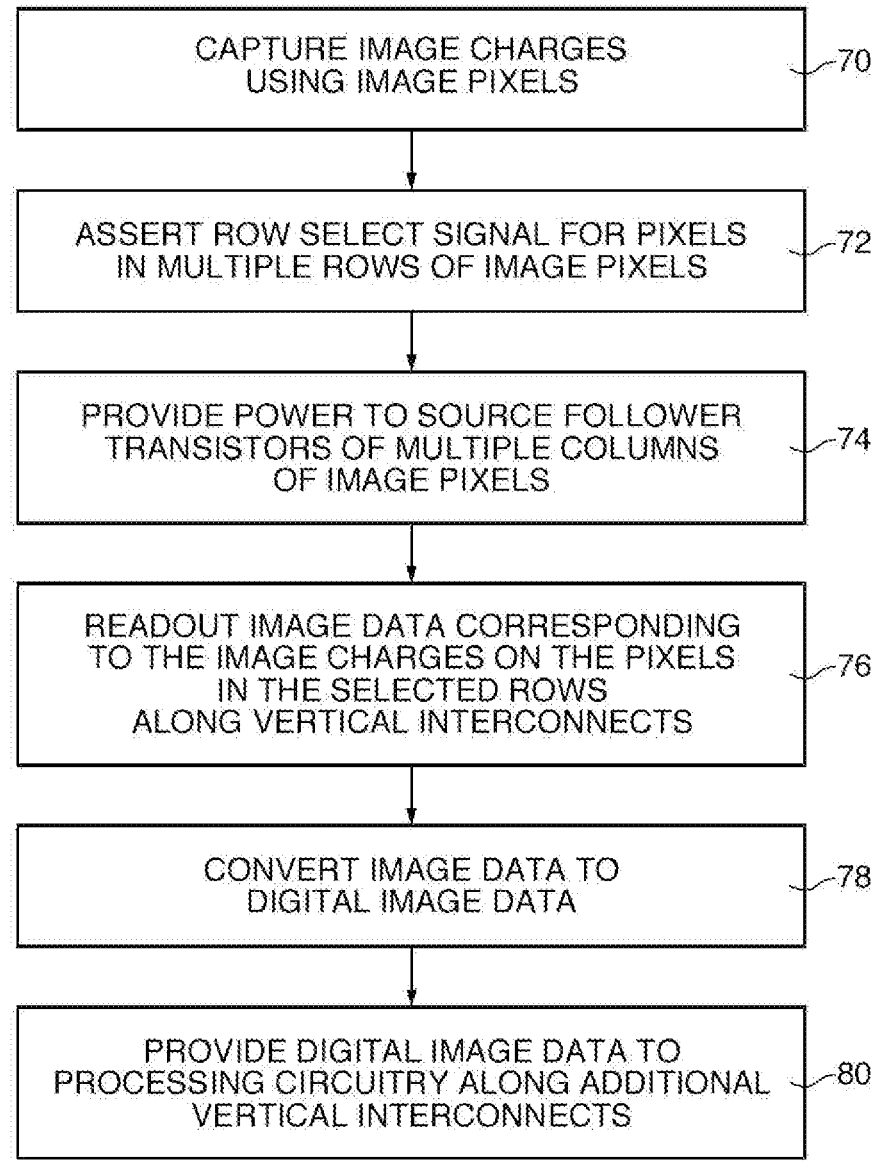
FIG. 10 is a flow chart of illustrative steps involved in capturing image data using a stacked-chip image sensor in accordance with an embodiment of the present invention.

FIG. 10 is a flow chart of illustrative steps that may be used in operating a stacked-chip image sensor.

At step 70, pixels such as pixels 30 of an image pixel array such as image pixel array 17 in a stacked-chip image sensor may be used to collect image charges (e.g., photodiodes 22 may convert image light into electrical charges). Image charges may be transferred to a charge storage node such as floating diffusion 26 in each pixel.

At step 72, a row select signal RS may be asserted using control circuitry such as control circuitry 44. The row select signal RS may be provided to multiple rows of pixels 30 over vertical row interconnects or vertical internal row interconnects (e.g., through-silicon vias, microbumps, etc.) from control circuitry 44.

At step 74, while the row select signal RS is provided to the selected rows of pixels 30 over the vertical interconnects, power (e.g., pixel power supply voltage Vaa_pix) may be provided to the source follower transistors of multiple columns of image pixels 30 over vertical column interconnects 40C.

At step 76, image data corresponding to the image charges on the charge storage nodes of the pixels in the selected rows and columns may be readout over multiple vertical interconnects such as a vertical block interconnect or a vertical internal row interconnects.

At step 78, an ADC converter such as ADC circuit 43 (see, e.g., FIG. 8) may be used to convert the image data into digital image data. A conversion gain factor may be applied by the ADC converter during conversion of the image data.

At step 80, the digital image data may be provided to processing circuitry such as storage and processing circuitry 50 over a vertical interconnect such as a through-silicon via.

Various embodiments have been described illustrating imaging systems having stacked-chip image sensors. An imaging system may include one stacked-chip image sensor or an array of stacked-chip image sensors. Each stacked-chip image sensor may include a vertical chip stack that includes an array of image pixels, analog control circuitry and storage and processing circuitry.

The image pixel array may be coupled to the control circuitry using vertical metal interconnects such as through-silicon vias or microbumps that route image data signals in a direction that is perpendicular to a plane defined by the array of image pixels. The vertical interconnects may include vertical column interconnects, vertical row interconnects, vertical block interconnects, or vertical internal row interconnects along an edge or interspersed within the array of image pixels.

The control circuitry may be configured to operate the image pixels for capturing image data and reading out image data. The control circuitry may route pixel control signals such as row select signals, transfer signals, and reset signals to the image pixels over, for example, the vertical row interconnects. The control circuitry may provide bias voltages and/or power supply voltages to, for example, source follower transistors of pixels in a given column of image pixels in order to select pixels in that column for readout. Image data signals may be read out along vertical interconnects such as vertical block interconnects associated with given blocks of image pixels. Multiple vertical block interconnects may be used to simultaneously readout pixels in multiple corresponding pixel blocks to analog-to-digital conversion circuitry associated with the control circuitry.

The analog-to-digital conversion circuitry may convert the image data to digital image data and provide the digital image data to the storage and processing circuitry over vertical conductive interconnects such as through-silicon vias. The storage and processing circuitry may be configured to store and/or process the digital image data.

The foregoing is merely illustrative of the principles of this invention which can be practiced in other embodiments.

What is claimed is:

1. A stacked-chip image sensor, comprising:
    a semiconductor substrate having opposing first and second surfaces;
    an array of image sensor pixels in the semiconductor substrate that are configured to receive image light through the first surface; and
    control circuitry coupled to the array of image sensor pixels by a plurality of vertical conductive interconnects that extend through the second surface, the array of image sensor pixels comprising image sensor pixels arranged in pixel rows and pixel columns, and the plurality of vertical conductive interconnects comprising a plurality of vertical column interconnects, wherein each pixel column is coupled to a selected one of the vertical column interconnects.

2. The stacked-chip image sensor defined in claim 1, wherein the semiconductor substrate comprises a silicon semiconductor substrate and wherein the plurality of vertical conductive interconnects that extend through the second surface comprises a plurality of through-silicon vias that couple the control circuitry to the array of image sensor pixels through the second surface.

3. The stacked-chip image sensor defined in claim 1 wherein the plurality of vertical conductive interconnects that extend through the second surface comprises a two-dimensional array of microbumps that protrude from the second surface.

4. The stacked-chip image sensor defined in claim 1 wherein the control circuitry comprises row driver circuitry coupled to the vertical conductive interconnects and wherein the row driver circuitry is configured to supply pixel control signals to the image sensor pixels over the vertical conductive interconnects.

5. The stacked-chip image sensor defined in claim 4 wherein the plurality of vertical column interconnects are coupled to the pixel columns along an edge of the array of image sensor pixels and wherein the array of image sensor pixels comprises a plurality of pixel blocks, the stacked-chip image sensor further comprising:
a plurality of vertical internal row interconnects coupled to each of the pixel rows, wherein each of the plurality of vertical internal row interconnects is coupled a selected one of the pixel rows along an edge of an associated pixel block and wherein each of the plurality of vertical internal row interconnects couples image sensor pixels in the associated pixel block to the control circuitry through the second surface.

6. The stacked-chip image sensor defined in claim 1, wherein the control circuitry comprises a plurality of analog to digital converter circuits and wherein each of the vertical column interconnects is coupled to a selected one of the analog to digital converter circuits.

7. The stacked-chip image sensor defined in claim 1, wherein the semiconductor substrate is formed in a first semiconductor integrated circuit and the control circuitry is formed in a second semiconductor integrated circuit that is different from the first semiconductor integrated circuit.

8. A stacked-chip image sensor, comprising:
a semiconductor substrate having opposing first and second surfaces;
an array of image sensor pixels in the semiconductor substrate that are configured to receive image light through the first surface; and
control circuitry coupled to the array of image sensor pixels by a plurality of vertical conductive interconnects that extend through the second surface, wherein the array of image sensor pixels comprises a plurality of pixel blocks, the plurality of vertical conductive interconnects comprises a plurality of vertical block interconnects, and each of the plurality of vertical block interconnects couples the image sensor pixels of a respective one of the plurality of pixel blocks to the control circuitry through the second surface.

9. The stacked-chip image sensor defined in claim 8, wherein the plurality of pixel blocks comprises a first pixel block and a second pixel block that is different from the first pixel block, a first vertical block interconnect of the plurality of vertical block interconnects couples the image sensor pixels of the first pixel block to the control circuitry through the second surface, and a second vertical block interconnect of the plurality of vertical block interconnects that is different from the first vertical block interconnect couples the image sensor pixels of the second pixel block to the control circuitry through the second surface.

10. The stacked-chip image sensor defined in claim 8, wherein each pixel block of the plurality of pixel blocks includes a given number of image sensor pixels.

11. The stacked-chip image sensor defined in claim 8, wherein each pixel block of the plurality of pixel blocks includes image sensor pixels from a first number of pixel columns and a second number of pixel rows, wherein the first number is greater than the second number.

12. The stacked-chip image sensor defined in claim 8, wherein the semiconductor substrate is formed in a first semiconductor integrated circuit and the control circuitry is formed in a second semiconductor integrated circuit that is different from the first semiconductor integrated circuit.

13. The stacked-chip image sensor defined in claim 8, wherein the control circuitry is configured to simultaneously select a plurality of rows of image sensor pixels in the array and to read out image data from a plurality of image sensor pixels in each of the simultaneously selected rows of image sensor pixels.

14. The stacked-chip image sensor defined in claim 8 wherein each of the image sensor pixels comprises a source follower transistor having a first terminal coupled to a selected one of the vertical block interconnects.

15. The stacked-chip image sensor defined in claim 8 wherein the control circuitry comprises a ground plane in a semiconductor integrated circuit die and an additional ground plane in the semiconductor integrated circuit die.

16. An image sensor, comprising:
a first integrated circuit die having opposing first and second surfaces and an array of image sensor pixels, wherein the array of image sensor pixels comprises pixel blocks;
a second integrated circuit die coupled to the first surface of the first integrated circuit die, wherein the second integrated circuit die includes control circuitry for operating the image sensor pixels to capture image data; and
vertical conductive interconnects coupled between the control circuitry and the array through the first surface of the first integrated circuit die, wherein each of the vertical conductive interconnects is coupled to a corresponding one of the pixel blocks.

17. The image sensor defined in claim 16, wherein the control circuit is configured to provide control signals for capturing the image data to the pixel blocks over the vertical conductive interconnects.

18. The image sensor defined in claim 16, wherein the control circuit is configured to receive the image data from the pixel blocks over the vertical conductive interconnects.

19. The image sensor defined in claim 16, wherein the control circuitry comprises a plurality of analog-to-digital conversion circuits and wherein each of the analog-to-digital conversion circuits is coupled to a selected one of the vertical conductive interconnects.

20. The image sensor defined in claim 16, wherein the image sensor pixels are configured to generate the image data in response to light received through the second surface.

* * * * *